United States Patent [19]

Lucas

[11] Patent Number: 5,528,741
[45] Date of Patent: Jun. 18, 1996

[54] METHOD AND APPARATUS FOR CONVERTING FLOATING-POINT PIXEL VALUES TO BYTE PIXEL VALUES BY TABLE LOOKUP

[75] Inventor: Bruce D. Lucas, Yorktown Heights, N.Y.

[73] Assignee: International Business Machines Corporation, Armonk, N.Y.

[21] Appl. No.: 357,771

[22] Filed: Dec. 16, 1994

Related U.S. Application Data

[63] Continuation of Ser. No. 914,978, Jul. 15, 1992.

[51] Int. Cl.[6] .......................................... G06F 1/03
[52] U.S. Cl. ........................ 395/131; 364/745; 364/748
[58] Field of Search .................................. 395/100, 131; 364/748, 745; 345/153, 155

[56] References Cited

U.S. PATENT DOCUMENTS

| | | | |
|---|---|---|---|
| 3,872,442 | 3/1975 | Boles et al. ............................. | 395/375 |
| 4,620,292 | 10/1986 | Hagiwara et al. ...................... | 364/748 |
| 4,631,696 | 12/1986 | Sakamoto ............................... | 364/748 |
| 4,670,793 | 6/1987 | Yamada et al. ........................ | 358/463 |
| 4,720,809 | 1/1988 | Taylor .................................... | 364/748 |
| 4,757,384 | 7/1988 | Nonweiler et al. .................... | 348/581 |
| 4,831,575 | 5/1989 | Kuroda .................................. | 364/748 |
| 4,866,637 | 9/1989 | Gonzales-Lopez et al. ........... | 364/518 |
| 4,916,531 | 4/1990 | Genz et al. ............................. | 358/530 |
| 4,918,740 | 4/1990 | Ross ........................................ | 382/9 |
| 4,939,686 | 7/1990 | Fandrianto ............................. | 364/752 |
| 4,982,342 | 1/1991 | Moribe et al. ......................... | 395/100 |
| 4,985,848 | 1/1991 | Pfeiffer et al. ......................... | 395/164 |
| 5,003,299 | 3/1991 | Batson et al. ........................ | 345/155 X |
| 5,025,249 | 6/1991 | Seiler et al. ........................... | 345/119 |
| 5,025,407 | 6/1991 | Gulley et al. .......................... | 364/754 |
| 5,068,644 | 11/1991 | Batson et al. ........................ | 345/155 X |
| 5,128,889 | 7/1992 | Nakano .................................. | 364/748 |
| 5,182,723 | 1/1993 | Kamimura ............................. | 364/748 |
| 5,184,317 | 2/1993 | Pickett .................................... | 364/735 |
| 5,282,036 | 1/1994 | Worley, Jr. et al. ................... | 358/164 |
| 5,325,316 | 6/1994 | Koshiba ............................... | 364/745 X |
| 5,329,475 | 6/1994 | Juri et al. ............................... | 364/745 |
| 5,333,261 | 7/1994 | Gutlag et al. ........................ | 345/155 X |
| 5,432,893 | 7/1995 | Blasubramanian et al. ........... | 395/131 |
| 5,434,809 | 7/1995 | Taniguchi ............................... | 364/752 |
| 5,442,379 | 8/1995 | Bruce et al. ........................... | 345/199 |

FOREIGN PATENT DOCUMENTS

| | | | |
|---|---|---|---|
| 3-14128 | 3/1991 | Japan .............................. | G06F 7/00 |
| 2185606 | 1/1987 | United Kingdom . | |

OTHER PUBLICATIONS

Hayes, Computer Architecture and Organization, 1978, pp. 157–159.
Tanenbaum, Structured Computer Organization, 1984 pp. 10–11.
Kuck et al, Analysis of Rounding Methods in Floating Point Arithmetic, IEEE Transactions on Computers, vol. C–26, No. 7, Jul. 1977 pp. 643–650.
Novell, Xtrieve Interactive Query Manual, 1988, pp. C–2, C–4.
Yohe, Roundings in Floating Point Arithmetic, IEEE Transactions on Computers, Jun. 1973, pp. 577–586.
Lacroix, Floating Point Signal Processing, Circuits and Systems 1988 IEEE International Symposium, 1988, pp. 2023–2030.
Patent Abstract of Japan, vol. 6, No. 192, "Function Converting Circuit", 57–101922(A), Sep. 1982.

*Primary Examiner*—Mark K. Zimmerman
*Assistant Examiner*—Anton W. Fetting
*Attorney, Agent, or Firm*—Perman & Green

[57] ABSTRACT

Method and apparatus for generating integer pixel values from floating point values using table lookup. The method includes the steps of (a) providing a floating-point representation of a pixel value; and (b) applying the floating-point representation as an index into a lookup table. The lookup table includes a memory device having a plurality of entries. Each of the entries is uniquely indexed by one value of a floating-point representation of a pixel value, and each of the entries stores a corresponding integer representation of the pixel value. A third step (c) outputs from the lookup table the integer representation of the pixel value that corresponds to the applied floating-point representation. It is shown that only a sub-set of the entire floating-point representation need be employed as a table index value, specifically the sign bit, the exponent, and a portion of the mantissa.

13 Claims, 2 Drawing Sheets

METHOD AND APPARATUS FOR CONVERTING FLOATING-POINT PIXEL VALUES TO BYTE PIXEL VALUES BY TABLE LOOKUP

This is a continuation of copending application Ser. No. 07/914,978, filed on Jul. 15, 1992.

FIELD OF THE INVENTION

This invention relates generally to data processing systems having display apparatus and, in particular, to methods and apparatus for displaying graphical and other images.

BACKGROUND OF THE INVENTION

In many computer graphics applications it is either necessary or convenient to employ floating-point numbers during the process of computing pixel values, wherein a pixel is a picture element that is a smallest displayable unit of an image. That is, for some applications the additional precision inherent in a floating-point representation is desirable, or the convenience of the automatic scaling of a floating-point representation makes the programming and/or computation of pixel values more efficient.

One such application is known as ray-tracing, where many small effects (e.g. multiple reflections and multiple light sources) must be accumulated for each pixel. Another application where a floating-point pixel representation is advantageous is volume rendering, where each layer of a volume may make a contribution to a pixel value, and many such small contributions must be accumulated.

However, when displaying the resulting pixel values the floating-point values must, typically, be converted to one-byte values in that most display devices operate with one-byte pixel values. Typically, three such one-byte values are used for each pixel, one for each of the primary colors (red, green, and blue).

The process of converting the floating-point values to one-byte values includes a number of steps which, when taken together, are time consuming and often decrease the efficiency of the system. Typically, these steps include the following.

Scaling of pixel values: For example, the floating-point pixel values may be, by convention, in the range from 0.0 to 1.0; but the one-byte pixel values are, by definition, in the range from 0 to 255. As a result, multiplication of the floating-point pixel values by 255 is required. However, a floating-point multiplication can be a relatively time-consuming operation. Furthermore, the use of hardware multipliers increases the cost, complexity, and power consumption of the system.

Range limiting: In that the range of floating-point numbers is very large compared to the range of one-byte values, at times a floating-point pixel value is found to be outside of the range of byte values. For example, using the assumption of the preceding paragraph that the floating-point values are to be scaled by 255, a floating-point pixel value of, for example, 1.01 would be converted to an integer value of 257. However, 257 cannot be represented as a one-byte value, and must be represented instead by the maximum possible one-byte value, 255. Similarly, floating-point pixel values of less than zero must be represented by a byte pixel value of 0. Range limiting is typically accomplished by two comparisons (one comparison with the minimum value and one comparison with the maximum value) and with conditional branches. However, conditional branches are relatively time-consuming operations in modern data processors in that they interrupt the flow of processor pipelines.

Gamma correction: Most computer displays exhibit a non-linear relationship between pixel values and screen brightness, typically of the form $$\text{brightness} = (\text{pixel value})^{gamma},$$

where "gamma" is a number that is characteristic of a particular display monitor. To compensate for this effect, it is desirable to use a pixel value computed according to the formula $$\text{pixel value} = (\text{desired brightness})^{(1/gamma)}.$$

Generally the floating-point pixel value described above is taken to represent the desired brightness. However, the required exponentiation operation is a computationally expensive process.

A final pixel operation is the required conversion from the floating-point representation to an integer representation prior to display of the pixel.

Thus, for this example the operations required to convert a floating-point pixel value to a byte pixel value are as follows (expressed in the C programming language):

float in;

unsigned char out;

if (in<0) out= 0; /* Range Limiting */ else if (in>1.0) out= 255; /* Range Limiting */ else out= 255.0 * pow(in, 1.0/gamma); /* Scaling and Gamma correction */

It is noted that the conversion from floating-point to integer is implicit in the "else out" assignment.

In this example, even if the gamma correction is omitted, the resulting calculation still requires a considerable amount of processing time for each pixel. In that a typical display screen may display several hundreds of thousands or millions of pixels, each having a red, green, and blue constituent, it can be realized that a considerable amount of processing effort may be expended to generate but one displayable image frame.

It is thus an object of this invention to provide an efficient method for converting a floating-point pixel representation into a displayable integer pixel representation.

It is a further object of this invention to provide an efficient technique for performing at least one operation on a pixel that is expressed in a floating-point representation, and to provide as a result of the operation an integer representation of the pixel.

SUMMARY OF THE INVENTION

The foregoing and other problems are overcome and the objects of the invention are realized by a method of generating a value of a pixel, and by apparatus for accomplishing the method. The method includes the steps of (a) providing a floating-point representation of a pixel value; and (b) applying the floating-point representation as an index into a lookup table, the lookup table including a memory device having a plurality of entries. Each of the entries is uniquely indexed by one value of a floating-point representation of a pixel value, and each of the entries stores a corresponding integer representation of the pixel value. A third step (c) outputs from the lookup table the integer representation of the pixel value that corresponds to the applied floating-point representation.

The floating point representation of the pixel value may be a single-precision floating-point representation, a double-precision floating-point representation, or any suitable floating-point representation having an exponent field, a mantissa field, and, optionally, a sign bit.

The memory device has a plurality of address inputs. A first plurality of the address inputs are coupled to exponent bits of the floating-point representation of the pixel value and a second plurality of the address inputs are coupled to a sub-set of the mantissa bits of the floating-point representation of the pixel value. One of the plurality of address inputs may be coupled to the sign bit. In a preferred embodiment of the invention the lookup table is indexed by one sign bit, eight exponent bits, and seven mantissa bits, and the integer pixel value is expressed in eight bits.

The integer representation of the pixel value further represents at least one operation that is performed upon the corresponding floating-point representation of the pixel value, wherein the at least one operation is selected from a group of operations such as scaling, range limiting, and gamma correction.

An initial step of the method initializes the lookup table by storing, within each of the entries of the lookup table, an integer pixel value that is a function of a value of the associated floating-point representation. The step of storing includes a first step of performing at least one operation on the floating-point representation of the pixel value, the at least one operation being selected from the group of operations such as scaling, range limiting, and gamma correction.

It is shown that only a sub-set of the entire floating-point representation need be employed as a lookup table index value. In the presently preferred embodiment of the invention, only 16 bits of a 32-bit single-precision floating-point value are shown to be relevant to the result; specifically the sign bit, the exponent, and a portion of the mantissa.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Figure 1:
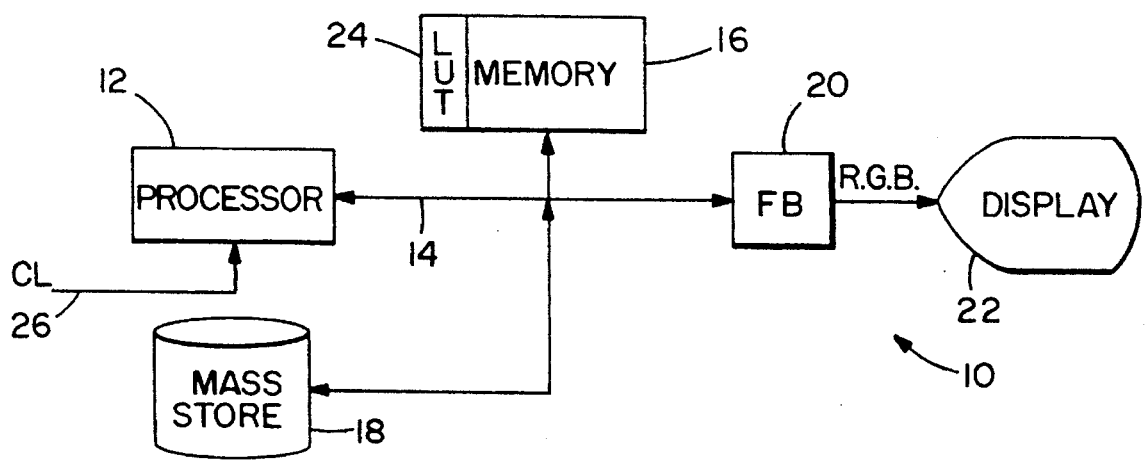
FIG. 1 is a block diagram of a data processing system that is constructed and operated in accordance with the invention.

Referring first to FIG. 1, there is illustrated a data processing system 10, also referred to herein as a workstation, that is constructed and operated in accordance with the invention. System 10 includes a processor 12 that is bidirectionally coupled to a bus 14. The bus 14 includes address, data, and control signal lines and operates in a conventional manner. Also coupled to the bus 14 is a memory 16, a mass storage device 18, such as a disk drive, and a frame buffer (FB) 20 that stores at least one displayable frame of image pixels. An output of the frame buffer 20 provides red (R), green (G), and blue (B) signals to a display device 22. By example, three digital to analog (D/A) converters (not shown) may be provided for converting 8-bit pixel values output by the frame buffer 20 into corresponding R, G, B analog signals that are suitable for driving the display device 22. The display device 22 includes means for displaying a plurality of pixels in a conventional manner.

The memory 16 includes storage for a processor 12 operating program, including programs that implement the method of the invention that is described below. In this embodiment of the invention the memory 16 also includes a floating-point to integer conversion lookup table (LUT) 24.

In accordance with the invention, the system 10 is operated so as to perform one or more of the above described pixel operations; i.e. pixel scaling, range limiting, gamma correction, and/or floating-point to integer conversion, as well as other desired pixel value transformations, by an efficient table lookup technique.

As employed herein, a suitable floating-point representation is specified in ANSI/IEEE Standard 754, although the use of other floating-point representations are within the scope of the teaching of the invention.

During the operation of the system 10, the floating-point pixel representations may be obtained from the mass storage device 18 and/or through a communication link (CL) 26 from a remote image generation or processing system. The floating-point pixel representations may also be generated by the operation of the processor 12, or by another local processor if the system 10 is a multi-processor system, and stored within a region of the memory 16 that is separate from the LUT 24. By example only, the floating-point pixel value representations may represent the result of a ray tracing and/or a volume rendering operation that is performed upon a scene to be displayed.

One suitable basis for the table lookup technique of the invention is the well-known IEEE single-precision floating-point number representation that is widely used in data processing systems, such as workstations. The presently preferred IEEE single-precision floating-point representation is shown in FIG. 2.

Figure 2:
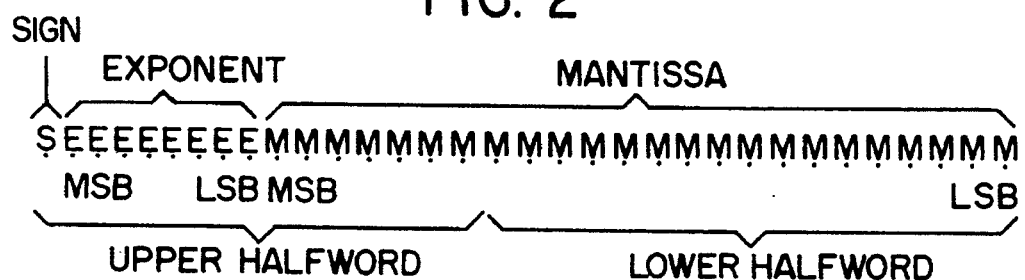
FIG. 2 shows a floating-point pixel representation that is employed by the invention.

In FIG. 2, each letter represents a bit. The "S" represents the sign bit, which indicates the sign (±) of the number. The "E"s represent the exponent of the number (eight bits), and the "M"s represent the mantissa (23 bits). In addition to the 23 mantissa bits shown in FIG. 2, the IEEE single-precision standard assumes a "hidden" extra high-order mantissa bit having a value of one.

As can be seen, the bits may be grouped together into two 16-bit "halfwords", and demonstrate that the high-order 16 bits of a single-precision floating-point number contain eight bits of precision, including the hidden high-order mantissa bit. It can therefore be realized that employing only the high-order halfword of an IEEE single-precision floating-point number introduces a representation error on the order of only $2^{-8}$. For a typical pixel value conversion operation only eight bits of precision are available in the result (the one-byte pixel value), and thus the high-order 16-bits of the single-precision floating-point number provide sufficient precision to represent all 256 of the possible eight bit pixel values.

The high-order 16 bits of the single-precision floating-point number may assume only $2^{16}$, or 65,536 distinct values, and therefore a LUT 24 having 65,536 entries is sufficient to perform any desired conversion. Moreover, each LUT 24 entry requires only a single byte. As a result, the maximum LUT 24 size is only 65,536 bytes, which represents a relatively small amount of storage in a modern workstation.

Figure 3:
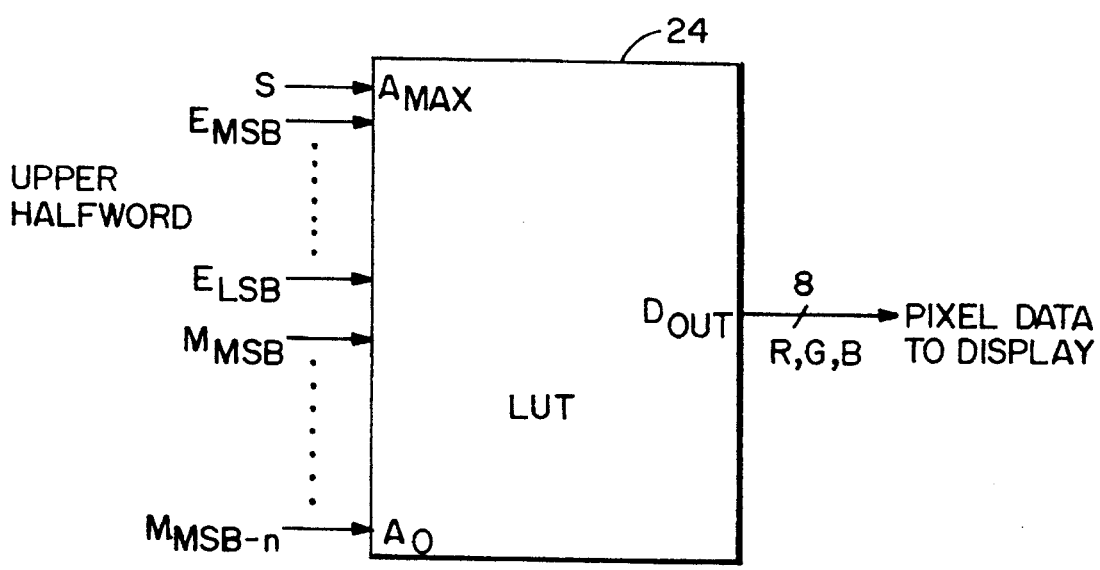
FIG. 3 illustrates a lookup table (LUT) that is addressed by the upper halfword of the floating-point pixel representation of FIG. 2.

FIG. 3 illustrates a discrete memory device implementation of the LUT 24 of FIG. 1, and shows the coupling of the upper halfword of the single-precision floating-point number to the LUT 24 address (A) inputs. A LUT 24 data out path ($D_{OUT}$) has a width of eight bits for providing the converted integer pixel value. It should be realized that, in some embodiments of the invention, the LUT 24 may be embodied in a memory device or devices, as in FIG. 3, that are separate from the memory devices that comprise the system memory 16. The memory device(s) may be system programmable, such as a static RAM, or may be preprogrammed, such as a ROM.

Figure 4:
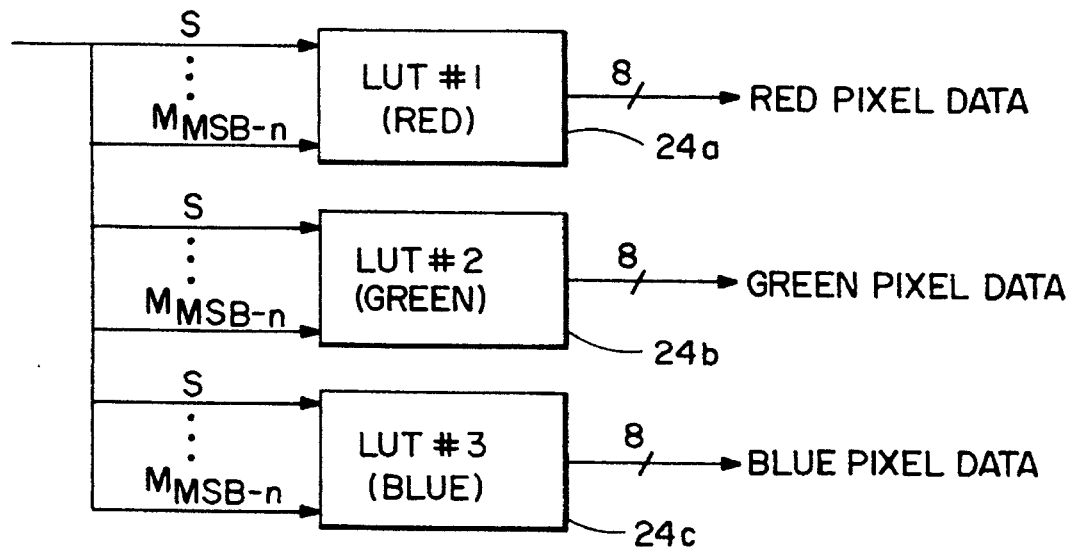
FIG. 4 illustrates a further embodiment of the invention wherein the LUT is partitioned into three LUTs, one being assigned to each of the primary colors.
Figure 5:
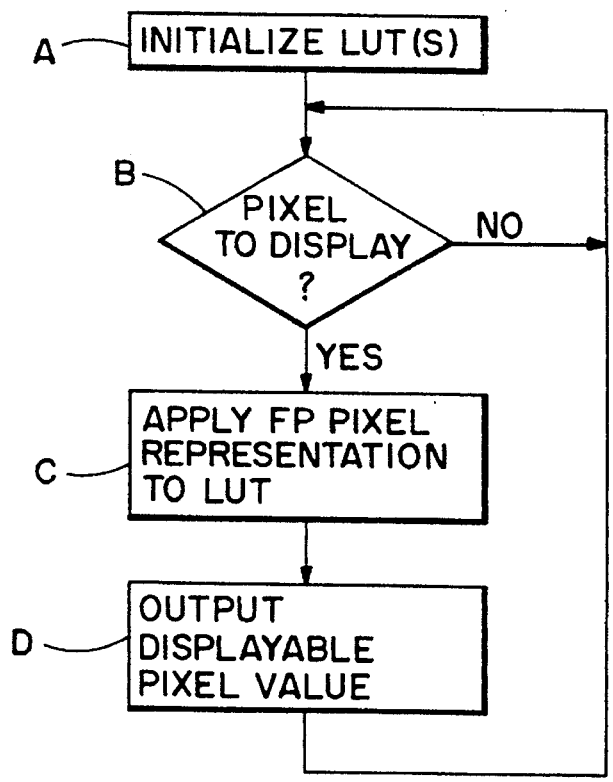
FIG. 5 is a flowchart that illustrates a method of the invention.

Furthermore, more than one LUT 24 may be provided. As seen in FIG. 4, three LUTs 24a, 24b, and 24c are employed, with each of the LUTs being associated with one of the RGB pixel values. This embodiment provides an advantage that the three conversions for a given pixel may proceed in a parallel, as opposed to a serial, manner.

In accordance with the teaching of the invention, the operations required for each conversion are reduced to:

```
float in;
unsigned char out;
unsigned char *table;
out = table[*(short*)&in];
```

This C-language code fragment assumes that the MSB is stored first before the LSB. However, in some systems the LSB may be stored first before the MSB, and a corresponding modification is made to the code. The required modification can be readily made by one skilled in the art.

An examination of the machine operations underlying this technique, compared with the machine operations underlying the exemplary implementation of the conversion described above, shows clearly that the technique of the invention is significantly more efficient.

It should be noted that although the size of the LUT 24 is 65,536 bytes, many of the LUT 24 entries exist only to accommodate the relatively rare situations where pixel values are out of range. In general, the great majority of the pixel values are accommodated by a relatively small number of LUT 24 entries. For example, only 1024 of the bit patterns of the high-order sixteen bits of a single-precision IEEE floating-point value represent numbers in the range from 1/256 to 1; but these 1024 table entries have been found to account for more than 99.5% of the pixel values encountered in a typical display scene. In a workstation having a cache memory for storing most often accessed data, the result is that the most recently used LUT 24 entries will be encached, thereby providing a significant increase in the access speed of the most recently used values.

It should also be noted that for an application wherein the sign of the floating-point representation is known to be always either positive or negative, that the sign (S) bit is not required as an address (index) input to the LUT 24. Eliminating the sign bit reduces by one half the required size of the LUT.

As seen in Block A of the flowchart of FIG. 6, initialization of the LUT 24 need occur only once. Initialization is accomplished by treating in turn each entry of the LUT 24, generating the corresponding floating-point value, and storing in the LUT 24 entry the desired function of that pixel value. The following code fragment illustrates one suitable LUT 24 initialization technique:

```
short i;
float f = 0.0;
unsigned char table;
for (i=0; i<65536; i++) {
    *(short *)&f = i;
    table[i] = ... desired function of f ... }
```

As before, this code assumes that the MSB is stored first.

It should be realized that the LUT 24 may perform another function besides converting a given single-precision floating-point pixel representation into an integer pixel representation. That is, other pixel operations, such as scaling, range checking, and gamma correction, are also accommodated by performing these operations during initialization, and storing the result into the corresponding LUT 24 entry. As a result, when a given floating-point pixel representation is later presented to the LUT 24, the resulting eight bit pixel value represents a scaled, range-checked, and gamma corrected integer pixel representation that is a function of the floating-point representation.

During the subsequent operation of the system 10 the Blocks B, C, and D are executed. For each pixel to be displayed (Block B) the floating-point representation is applied to the LUT 24 (Block C), and the resulting LUT 24 output is provided to the display device 22.

Based on the foregoing, it can be realized that one aspect of the invention employs a floating-point value as an address or index into a lookup table. Although the use of lookup tables for performing various operations is well known, the conventional usages of such tables employ fixed-point values or integers to index into the table. That is, an aspect of the invention is a realization that the bit pattern of a floating-point value may be used as an index into a lookup table.

A further aspect of the invention is a realization that, although floating-point values are generally 32-bits or more, there are a number of significant applications where only a sub-set of the entire floating-point representation need be employed as a table index value. In the presently preferred embodiment of the invention, only 16-bits of the 32-bit single-precision floating-point value are relevant to the result; specifically the sign bit, the exponent, and a portion of the mantissa. This is significant, in that a 32-bit quantity used as an index into a lookup table would require an impractically large lookup table. However, a lookup table based on a 16-bit index value is of reasonable size (65,536 entries) relative to modern memory technology.

Although described in the context of single-precision floating-point representations of pixels, it should be realized that a double-precision representation may also be employed, in conjunction with a suitable alteration being made to the size of the LUT. Furthermore, other than the ANSI/IEEE Standard 754 floating-point representation may be employed. That is, the teaching of the invention is applicable to any digital number representation scheme that employs an exponent field, a mantissa field, and, optionally, a sign bit.

It should also be realized that the teaching of the invention is applicable to conversions and operations on other than pixel data, and may be employed for other applications wherein it is desired to convert a floating-point representation to another representation, while also possibly performing one or more operations on the floating-point representation, such as scaling.

Thus, while the invention has been particularly shown and described with respect to a preferred embodiment thereof, it will be understood by those skilled in the art that changes in form and details may be made therein without departing from the scope and spirit of the invention.

Having thus described my invention, what I claim as new, and desire to secure by Letters Patent is:

1. Image display apparatus, comprising:

pixel value memory means having a plurality of memory locations for storing words of data, each of said words of data comprising a predetermined standard representation of a Z-bit floating-point value that specifies an image pixel, said Z-bit floating-point value including at least an N-bit exponent portion and an M-bit mantissa portion, said N-bit exponent portion and a most significant portion of said M-bit mantissa portion being stored in a most significant half-word of each of said words and a least significant portion of said M-bit mantissa portion being stored in a least significant half word of each of said words;

a look-up table memory comprised of a plurality of address input signal lines and a plurality of data output signal lines, said look-up table memory being further comprised of a plurality of storage locations individual ones of which store an X-bit pixel value in integer form, individual ones of said plurality of storage locations being selectively addressable by an address applied to said plurality of address input signal lines, wherein said plurality of address signal lines are coupled to an output of said pixel value memory means for receiving only most significant half words from said pixel value memory means, wherein N individual ones of said plurality of address signal lines are coupled to N bits of said N-bit exponent portion of a most significant half word, wherein Y individual ones of said plurality of address signal lines are coupled to Y most significant bits (MSBs) of said most significant M-bit mantissa portion of the most significant half word, wherein Y is less than M, and wherein X is less than (N+Y); and display means, having an input coupled to said plurality of data output signal lines, for storing X-bit pixel values output from said look-up table memory and for displaying individual ones of said pixels in accordance with information that is specified by said X-bit integer pixel value.

2. Image display apparatus as set forth in claim 1, wherein individual ones of said pixel values are processed prior to storage in said look-up table memory so as perform one or more of the operations of gamma correction, scaling, and range limiting.

3. Image display apparatus as set forth in claim 1, wherein Z equals 32, wherein N equals eight, wherein Y equals seven, and wherein X equals eight.

4. Image display apparatus as set forth in claim 1, wherein said Z-bit floating-point value further includes a sign bit, and wherein one of said plurality of address signal lines is coupled to said sign bit.

5. Image display apparatus, comprising:

pixel value memory means having a plurality of memory locations for storing words of data, each of said words of data comprising a predetermined standard representation of a Z-bit floating-point value that specifies an image pixel, said Z-bit floating-point value including at least an N-bit exponent portion and an M-bit mantissa portion, said N-bit exponent portion and a most significant portion of said M-bit mantissa portion being stored in a most significant half-word of each of said words and a least significant portion of said M-bit mantissa portion being stored in a least significant half word of each of said words;

a plurality of look-up table memories individual ones of which are each comprised of a plurality of address input signal lines and a plurality of data output signal lines, each of said plurality of look-up table memories being further comprised of a plurality of X-bit storage locations individual ones of which store a component of a pixel value in integer form, individual ones of said plurality of storage locations being selectively addressable by an address applied to said plurality of address input signal lines, wherein said plurality of address signal lines of each of said plurality of look-up table memories are coupled to an output of said pixel value memory means for receiving only most significant half words from said pixel value memory means, wherein N individual ones of said plurality of address signal lines are coupled to N bits of said N-bit exponent portion of a most significant half word, wherein Y individual ones of said plurality of address signal lines are coupled to Y most significant bits (MSBs) of said M-bit mantissa portion of the most significant half word, wherein Y is less than M, and wherein X is less than (N+Y); and display means, having an input coupled to said plurality of data output signal lines of each of said plurality of look-up table memories, for storing X-bit pixel values output from each of said plurality of look-up table memories and for displaying individual ones of said pixels in accordance with information that is specified by said X-bit integer pixel values.

6. Image display apparatus as set forth in claim 5 wherein said component is a color.

7. Image display apparatus as set forth in claim 5, wherein individual ones of said pixel values are processed prior to storage in said plurality of look-up table memories so as perform one or more of the operations of gamma correction, scaling, and range limiting.

8. Image display apparatus as set forth in claim 5, wherein Z equals 32, wherein N equals eight, wherein Y equals seven, and wherein X equals eight.

9. Image display apparatus as set forth in claim 5, wherein said Z-bit floating-point value further includes a sign bit, and wherein one of said plurality of address signal lines of each of said plurality of look-up table memories is coupled to said sign bit.

10. A method for displaying an image comprised of image pixels, comprising the steps of:

storing in a memory a plurality of data words each representing a predetermined standard representation of a Z-bit floating-point value that specifies an image pixel, the Z-bit floating-point value including at least an N-bit exponent portion and an M-bit mantissa portion, the N-bit exponent portion and a most significant portion of the M-bit mantissa portion being stored in a most significant half-word of each of the plurality of data words and a least significant portion of the M-bit mantissa portion being stored in a least significant half word of each of the plurality of data words;

accessing the memory and applying only the most significant half-word of a Z-bit floating point value as an address to a plurality of address input signal lines of a look-up table memory, the look-up table memory having a plurality of data output signal lines and a plurality of storage locations individual ones of which store an X-bit pixel value in integer form, individual ones of the plurality of storage locations being selectively addressable by an address applied to the plurality of address input signal lines, wherein N individual ones of the plurality of address signal lines are coupled to N bits of said N-bit exponent portion, wherein Y individual ones of the plurality of address signal lines are coupled to Y most significant bits (MSBs) of the M-bit mantissa portion, wherein Y is less than M, and wherein X is less than (N+Y);

storing in a frame buffer the X-bit pixel values that are output from the look-up table memory; and displaying individual ones of the pixels in accordance with information that is specified by a corresponding one of the X-bit integer pixel values that is stored in the frame buffer.

11. A method as set forth in claim 10, and further comprising a step of processing individual ones of the pixel values prior to storage in the look-up table memory so as perform one or more of the operations of gamma correction, scaling, and range limiting.

12. A method as set forth in claim 10, wherein Z equals 32, wherein N equals eight, wherein Y equals seven, and wherein X equals eight.

13. A method as set forth in claim 10, wherein the Z-bit floating-point value further includes a sign bit, and wherein the step of applying applies the sign bit to one of the plurality of address signal lines.

\* \* \* \* \*